(12) United States Patent (10) Patent No.: US 11,713,516 B2
Mori et al. (45) Date of Patent: Aug. 1, 2023

(54) GROUP III NITRIDE CRYSTAL, GROUP III NITRIDE SUBSTRATE, AND METHOD OF MANUFACTURING GROUP III NITRIDE CRYSTAL

(71) Applicant: Panasonic Corporation, Osaka (JP)

(72) Inventors: Yusuke Mori, Osaka (JP); Masashi Yoshimura, Osaka (JP); Masayuki Imanishi, Osaka (JP); Akira Kitamoto, Osaka (JP); Tomoaki Sumi, Osaka (JP); Junichi Takino, Osaka (JP); Yoshio Okayama, Osaka (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 5 days.

(21) Appl. No.: 17/340,416

(22) Filed: Jun. 7, 2021

(65) Prior Publication Data

US 2021/0388529 A1 Dec. 16, 2021

(30) Foreign Application Priority Data

Jun. 12, 2020 (JP) .................................. 2020-102593

(51) Int. Cl.
```
C30B 29/38      (2006.01)
C30B 29/40      (2006.01)
C30B 25/02      (2006.01)
H01L 21/02      (2006.01)
C01B 21/06      (2006.01)
```
(52) U.S. Cl.
CPC ............. *C30B 29/38* (2013.01); *C30B 25/02* (2013.01); *C01B 21/0602* (2013.01); *H01L 21/0254* (2013.01); *H01L 21/02389* (2013.01); *H01L 21/02576* (2013.01); *H01L 21/02645* (2013.01)

(58) Field of Classification Search
CPC ....... C30B 29/38; C30B 29/40; C30B 29/403; C30B 29/406
See application file for complete search history.

(56) References Cited

U.S. PATENT DOCUMENTS 9,543,392 B1 * 1/2017 Jiang ..................... H01L 33/025
2002/0011599 A1 1/2002 Motoki et al.
(Continued)

FOREIGN PATENT DOCUMENTS

JP 2000-44400 2/2000
JP 2003-277182 10/2003
(Continued)

OTHER PUBLICATIONS

Takehiro Yoshida et al., "Ultrahigh-speed growth of GaN by hydride vapor phase epitaxy", Physics Status Solidi C No. 8, No. 7-8, pp. 2110-2112, 2011.

(Continued)

*Primary Examiner* — Matthew E. Hoban
(74) *Attorney, Agent, or Firm* — Wenderoth, Lind & Ponack, L.L.P.

(57) ABSTRACT

A group III nitride crystal, wherein the group III nitride crystal is doped with an N-type dopant and a hydrogen element, and the concentration of the N-type dopant is $1\times10^{20}$ cm$^{-3}$ or more, and the concentration of the hydrogen element is $1\times10^{19}$ cm$^{-3}$ or more.

8 Claims, 1 Drawing Sheet

(56) References Cited

U.S. PATENT DOCUMENTS

| | | | |
|---|---|---|---|
| 2007/0152232 A1* | 7/2007 | Kobayakawa | H01L 33/32 257/E31.02 |
| 2010/0244086 A1* | 9/2010 | Hanawa | H01L 21/0254 438/46 |
| 2011/0008930 A1* | 1/2011 | Sasaki | H01L 21/02664 257/E21.078 |
| 2011/0253034 A1* | 10/2011 | Iwata | C30B 29/406 118/724 |
| 2015/0311068 A1* | 10/2015 | Tsukada | H01L 21/02609 438/492 |
| 2016/0020284 A1* | 1/2016 | D'Evelyn | H01L 29/045 428/64.1 |
| 2016/0268129 A1 | 9/2016 | Mori et al. | |
| 2018/0195206 A1* | 7/2018 | Jiang | C30B 29/406 |
| 2019/0189438 A1* | 6/2019 | Mikawa | H01L 21/02609 |
| 2020/0266304 A1* | 8/2020 | Ueoka | H01L 29/47 |

FOREIGN PATENT DOCUMENTS

| | | |
|---|---|---|
| JP | 2016-121064 | 7/2016 |
| WO | 2008/152944 | 12/2008 |
| WO | 2015/053341 | 4/2015 |

OTHER PUBLICATIONS

S. Pimputkar et al., "Free electron concentration dependent sub-bandgap optical absorption characterization of bulk GaN crystals", Journal of Crystal Growth, 432, pp. 49-53, 2015.

Robert Kucharski et al., "Transparency of Semi-Insulating, n-Type, and p-Type Ammonothermal GaN Substrates in the Near-Infrared, Mid-Infrared, and THz Spectral Range", Crystals, 7, 187, 2017.

* cited by examiner

GROUP III NITRIDE CRYSTAL, GROUP III NITRIDE SUBSTRATE, AND METHOD OF MANUFACTURING GROUP III NITRIDE CRYSTAL

CROSS-REFERENCE TO RELATED APPLICATIONS

This application claims a priority of Japanese Patent Application No. 2020-102593 flied on Jun. 12, 2020, the contents of which is incorporated herein by reference.

BACKGROUND

1. Technical Field

The technical field relates to a group III nitride crystal, a group III nitride substrate, and a manufacturing apparatus for a group III nitride crystal.

2. Description of the Related Art

Semiconductors having group III nitride substrates are used In fields of optical devices such as semiconductor lasers and light emitting diodes, and high-frequency or high-power electronic devices. Such semiconductors can be expected to reduce a switching loss during power conversion as compared to silicon-based devices and therefore are attracting particular attention In recent years. To produce a high-frequency or high-power electronic device, it is necessary to produce the device on a high-quality group III nitride substrate capable of suppressing crystal defects generated In a device layer. Such group III nitride substrates may be manufactured by cutting out multiple substrates from a group III nitride crystal.

Methods of manufacturing a group III nitride crystal include, for example, a hydride vapor phase epitaxy method (hereinafter also referred to as HVPE method), an ammonothermal method, a sodium flux method, and an oxide vapor phase epitaxy method (hereinafter also referred to as OVPE method).

In the HVPE method, a hydrogen halide gas is introduced onto a single group III raw material to generate a halide gas, and the generated halide gas of the group III element is used as a raw material gas for crystal growth. For example, in the case of growing a gallium nitride crystal, an HCl gas is introduced onto Ga metal to produce a gallium chloride (e.g., GaCl) gas, and the gallium chloride-containing gas is used as a group III source to perform a high-speed growth at 1 mm/h or more (see, e.g., Yoshida et al., Physics Status Solidi C No. 8, No. 7-8, 2110-2112 (2011)). In the HVPE method, it is known that a group III nitride crystal having N-type conductivity is obtained by mainly adding a silicon element, a germanium element, an oxygen element, etc. to a group III nitride crystal. For example, a gallium nitride crystal having N-type conductivity is manufactured by adding the oxygen element to the crystal by the HVPE method (see, e.g., Japanese Laid-Open Patent Publication No. 2000-44400). In the HVPE method, a concentration of impurities added to a gallium nitride crystal is reduced so as to obtain a transparent crystal having an absorption coefficient of 1 $cm^{-1}$ or less for light having an energy of less than 3.39 eV, which is the band gap of gallium nitride (see, e.g., S. Pimputkar et al., J. Cryst. Growth 432 (2015) 49-53).

In the ammonothermal method, to manufacture a gallium nitride crystal, single crystal gallium nitride is manufactured by using polycrystalline gallium nitride as a raw material in ammonia in a supercritical state (see, e.g., Japanese Laid-Open Patent Publication No. 2003-277182). In this method, Impurities can be added to a manufactured crystal at a high concentration; however, in this case, the crystal may be colored yellow, brown, or black (see, e.g., R. Kucharski et al., Crystals 2017, 7, 187).

In the OVPE method, an oxide raw material gas is used to add the oxygen element to a group III nitride crystal at a high concentration so as to manufacture a crystal (see, e.g., WO 20151053341A1). In this method, a group-III oxide gas and a nitrogen element-containing gas are reacted to manufacture the group III nitride crystal.

The group III nitride crystals manufactured by the methods as described above can be processed to obtain group III nitride substrates. From the viewpoint of production cost, it is desirable to manufacture substrates by cutting out multiple substrates from the group III nitride crystal, and it is desired to reduce a material loss during processing. As a method of processing a group III nitride substrate, for example, a non-contact processing method using a laser such as a laser slice method and a stealth dicing method may be used. In such a non-contact processing method, a material loss during substrate manufacturing can significantly be reduced as compared to machining such as a wire slice method.

However, all of the HVPE method, the ammonothermal method, the sodium flux method, and the OVPE method have a problem that when an N-type dopant is added into a group III nitride crystal to increase a carrier concentration so as to increase the conductivity of the group III nitride crystal, the crystal is colored, and the absorption coefficient is increased.

Therefore, when a group III nitride substrate is cut out and manufactured from the group III nitride crystal having the conductivity increased by containing an N-type dopant at a high concentration, light is absorbed on or near the surface of the crystal in the case of a processing method using light, which makes it difficult to process the inside. To prevent coloring of a crystal, conventionally, the concentration of the N-type dopant element is adjusted, and the absorption coefficient is thereby kept at a low value in a wide wavelength region.

However, in this case, it is difficult to sufficiently improve the conductivity. Therefore, it is not easy to obtain a group III nitride crystal having both a low absorption coefficient and a high conductivity.

SUMMARY

The present disclosure was conceived in view of the situations and it is therefore one non-limiting and exemplary embodiment provides a group III nitride crystal having an excellent conductivity and a low absorption coefficient.

In one general aspect, the techniques disclosed here feature: a group III nitride crystal, wherein the group III nitride crystal is doped with an N-type dopant and a hydrogen element, and the concentration of the N-type dopant is $1\times10^{20}$ $cm^{-3}$ or more, and the concentration of the hydrogen element is $1\times10^{19}$ $cm^{-3}$ or more.

The present disclosure also provides a group III nitride substrate including the group III nitride crystal The present disclosure also provides a method of manufacturing a group III nitride crystal, includes:

Introducing a group III element-containing gas, a nitrogen element-containing gas, an N-type dopant-containing gas, and a hydrogen element-containing gas;

generating and growing a group III nitride crystal on a seed substrate by reacting the introduced group III element-containing gas, the nitrogen atom-containing gas, the N-type dopant-containing gas, and the hydrogen element-containing gas.

According to the present invention, a group III nitride crystal having an excellent conductivity and a low absorption coefficient can be obtained.

Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

BRIEF DESCRIPTION OF THE DRAWINGS

The present disclosure will become readily understood from the following description of non-limiting and exemplary embodiments thereof made with reference to the accompanying drawings, in which like parts are designated by like reference numeral and in which.

DETAILED DESCRIPTION

Figure 1:
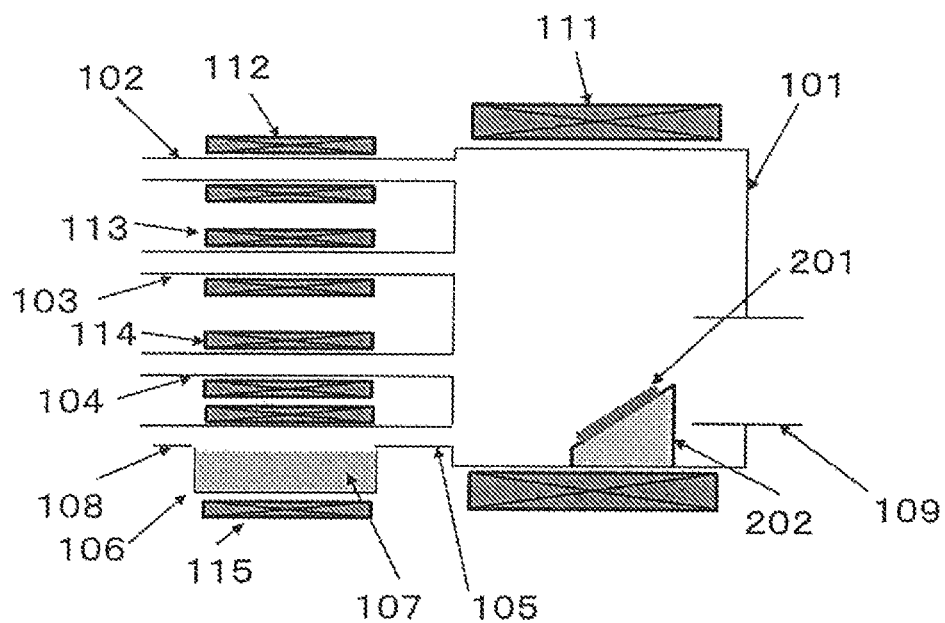
FIG. 1 is a cross-sectional view schematically showing an example of an apparatus used in a method of manufacturing a group III nitride crystal according to a first embodiment

A group III nitride crystal according to a first aspect,
wherein the group III nitride crystal is doped with an N-type dopant and a hydrogen element, and
the concentration of the N-type dopant is $1 \times 10^{20}$ cm$^{-3}$ or more, and the concentration of the hydrogen element is $1 \times 10^{19}$ cm$^{-3}$ or more.

Further, as a group III nitride crystal of a second aspect, in the first aspect, the concentration of the N-type dopant may be $7 \times 10^{2}$ cm$^{-3}$ or more and $5 \times 10^{21}$ cm$^{-3}$ or less.

Further, as a group III nitride crystal of a third aspect, in the first aspect, the N-type dopant may contain at least one selected from the group consisting of a silicon element, a germanium element, and an oxygen element Further, as a group III nitride crystal of a fourth aspect, in the third aspect, the N-type dopant may contain the oxygen element.

Further, as a group III nitride crystal of a fifth aspect, in the first aspect, a light having an energy achieving an absorption coefficient of 60 cm$^{-1}$ or less may exist within a range less than a band gap energy value of the group III nitride crystal.

Further, as a group III nitride crystal of a sixth aspect, in the first aspect, the light having an energy achieving an absorption coefficient of the group III nitride crystal of 60 cm$^{-1}$ or less may exist within a range less than 3.39 eV.

Further, as a group III nitride crystal of a seventh aspect, in the first aspect, the group III nitride crystal may have an electrical resistivity of 1 mΩ·cm or less.

A group III nitride substrate of an eighth aspect may include the group III nitride crystal of the first aspect.

Further, as a group III nitride substrate of a ninth aspect, in the eighth aspect, the group III nitride substrate may has a thickness of 100 μm or more.

A method of manufacturing a group III nitride crystal of tenth aspect, includes:

introducing a group III element-containing gas, a nitrogen element-containing gas, an N-type dopant-containing gas, and a hydrogen element-containing gas;

generating and growing a group III nitride crystal on a seed substrate by reacting the introduced group III element-containing gas, the nitrogen atom-containing gas, the N-type dopant-containing gas, and the hydrogen element-containing gas.

Further, as a method of manufacturing a group-III nitride crystal of eleventh aspect, in the tenth aspect, the N-type dopant-containing gas may contain at least one selected from the group consisting of a silicon element-containing gas, a germanium element-containing gas, and an oxygen element-containing gas.

Further, as a method of manufacturing a group-III nitride crystal of twelfth aspect, in the eleventh aspect, the N-type dopant-containing gas may contain the oxygen element-containing gas.

Further, as a method of manufacturing a group-III nitride crystal of thirteenth aspect, in the tenth aspect, the hydrogen element-containing gas may contain at least one selected from the group consisting of an N—H bond, a C—H bond, and an O—H bond in a molecule.

Further, as a method of manufacturing a group-III nitride crystal of fourteenth aspect, in the tenth aspect, the hydrogen element-containing gas may contain at least one selected from the group consisting of an ammonia gas, a hydrazine gas, a methylamine gas, an ethylamine gas, a methane gas, an ethane gas, a propane gas, a butane gas, an ethylene gas, an acetylene gas, water vapor, hydrogen peroxide, methanol, and ethanol.

Further, as a method of manufacturing a group-III nitride crystal of fifteenth aspect, in the tenth aspect, the nitrogen element-containing gas may contain at least one selected from the group consisting of an ammonia gas, a hydrazine gas, and a dimethylhydrazine gas.

Further, as a method of manufacturing a group-III nitride crystal of sixteenth aspect, in the tenth aspect, the group III element-containing gas may contain at least one of an oxide of a group III element and a halide of a group III element Further, as a method of manufacturing a group-III nitride crystal of seventeenth aspect, in the tenth aspect, the group III element-containing gas may contain at least one of $Ga_2O$ and GaCl.

BACKGROUND TO THE PRESENT DISCLOSURE

First, background to the present disclosure completed by the present inventors will be described.

The present inventors discovered that an absorption coefficient may significantly differ In Group III nitride crystals having the same N-type dopant concentration and the same carrier concentration, thought that the direct cause of decrease in the absorption coefficient is not an N-type dopant, and pursued the principle thereof.

The present inventors analyzed a light energy dependency of an absorption coefficient of a group III nitride crystal containing an N-type dopant at a high concentration. As a result, since the absorption coefficient left a trail exponentially decreasing from a band edge of the group III nitride crystal to the low energy side, the present inventors found a possibility that when the group III nitride crystal contains an N-type dopant at a high concentration, the increase In the absorption coefficient In a wide wavelength range is caused by a phenomenon called Urbach tail.

The phenomenon called Urbach tail is a phenomenon also seen in GaAs, which is a compound semiconductor, and In GaAs, the Urbach tail is more strongly observed as an additive concentration of a P-type dopant increases and, as a result, the absorption coefficient increases in a wide wavelength range.

The present inventors found out that the Urbach tail is proportional to the square of the ionic valence of point defects (including substitution by impurities) in the crystal contributing to the occurrence of the phenomenon, and the density of the point defects.

It is known that a vacancy defect of a group III element behaves as a trivalent P-type dopant In the group III nitride crystal. On the other hand, general N-type dopants such as the silicon element, the germanium element, and the oxygen element are monovalent N-type dopants in the group III nitride crystal. Although the P-type dopant and the N-type dopant are different and cannot simply be compared, it is inferred from the ionic valence that the vacancy defect of the group III element is highly effective In increasing the absorption coefficient as compared to the N-type dopant.

The present inventors focused on the fact that when the concentration of the N-type dopant is high, the density of vacancy defects of the group III element may increase In the group III nitride crystal. The present inventors made a hypothesis that the N-type dopant is not a direct cause of the increase in the absorption coefficient and the increase in the absorption coefficient is caused by an increase in the density of vacancy defects of the group III element generated when the N-type dopant is added to the group III nitride crystal at a high concentration.

Therefore, the present inventors conceived of adding a hydrogen atom to the vacancy defect of the group III element of the group III nitride crystal by containing the hydrogen element at a high concentration at the same time when the N-type dopant is contained at a high concentration. It can be expected that by adding the hydrogen atom, the absorption coefficient of the group-III element nitride crystal is reduced even when the N-type dopant is contained at a high concentration, i.e., both a low absorption coefficient and a high conductivity can be satisfied.

A method of adding hydrogen atoms to a vacancy defect of a group III element of a group III nitride crystal will be described. In the following description, the group III nitride crystal is manufactured by using gas; however, it is easily deduced that hydrogen atoms can be added even In the case of growth in a solution or a melt by making a study In the same way.

When the group III nitride crystal is manufactured by using a hydrogen element-containing gas so as to add a hydrogen atom to a vacancy defect of a group III element, it is necessary to bond the vacancy defect of the group III element to the hydrogen atom. Therefore, it is necessary to form an atomic structure in which a hydrogen atom is bonded to a nitrogen atom, or an atom substituting for a nitrogen atom, near the vacancy defect of the group III element.

For example, gallium nitride has a bonded structure ($V_{Ga}$—H structure) of a Ga vacancy defect and a hydrogen atom, and the binding energy of this structure is 3.25 eV. On the other hand, it is known that a bonded structure of the magnesium element and the hydrogen element (Mg—H structure) is decomposed by thermal annealing at 1000° C. to 1200° C., as the bond of the hydrogen atom is broken. The binding energy of the bonded structure of the magnesium element and the hydrogen element (Mg—H structure) is 1.6 eV. Therefore, it is considered that the $V_{GA}$—H structure decomposes at about 2200° C., which is about twice the absolute temperature of the Mg—H structure. Therefore, at the time of manufacturing at a temperature of 2200° C. or lower, the $V_{GA}$—H structure is not decomposed, so that the $V_{GA}$—H structure is sufficiently formable. Additionally, even when used as a device substrate, since the manufacturing temperature of the group III element nitride semiconductor device is generally 1200° C. or lower, the $V_{Ga}$—H structure is less likely to be decomposed even during device production, and it is unlikely that the added hydrogen atom is desorbed and adversely affects a device process.

When the group III nitride crystal is manufactured, hydrogen gas is generally used as a carrier gas, which means that the crystal is manufactured in an environment where hydrogen element is supplied at high concentration; however, the hydrogen element taken into the crystal is generally equal to or less than a detection limit according to a secondary ion mass spectrometry (SIMS) analysis, and it is presumed that the hydrogen element is not contained in the crystal.

The reason is probably as follows. A hydrogen molecule has a structure in which two hydrogen atoms are bonded, and it is necessary to break the bond between the hydrogen atoms so as to add a hydrogen atom to a vacancy defect of a group III element. However, since the bonding energy between hydrogen atoms In a hydrogen molecule is strong as generally known as 4.48 eV, and the molecular species highly reactive with hydrogen molecules is poor In the environment of manufacturing for the group III nitride crystal, it is considered difficult in the manufacturing environment of the group III nitride crystal to break the bond between hydrogen atoms in hydrogen molecules and add hydrogen atoms to the vacancy defects of the group III element.

Therefore, it is probably difficult to add the hydrogen element to the group III nitride crystal at high concentration by simply supplying the hydrogen gas.

Paying attention to a bonded structure ($V_{III}$—H structure) of the vacancy defect of the group III element and the hydrogen atom, a hydrogen atom is bonded to a nitrogen atom or an atom of an impurity substituting for a nitrogen atom in this structure. Therefore, it is considered effective to supply a molecule having a structure in which a nitrogen atom or an impurity atom substituting for a nitrogen atom In a group III nitride crystal and a hydrogen atom are bonded.

Examples of the bonded structure between a nitrogen atom or an impurity atom substituting for a nitrogen atom in a group III nitride crystal and a hydrogen atom mainly include N—H, C—H, and O—H, other bonded structures playing an equivalent role may be used.

From the above, it is considered that if a hydrogen element-containing gas having any of the bonded structures described above is supplied, the hydrogen element can be contained at high concentration in the group III nitride crystal.

Although point defects of group III elements of the group III nitride crystals can be measured by the positron pair annihilation method, this method is dangerous since the measurement is performed by using positrons generated from radioactive isotopes, and therefore, it is difficult to easily perform the measurement. Additionally, quantification of defect density requires comparison with a group III nitride crystal having an extremely low defect density; however, the crystal having an extremely low defect density is difficult to obtain, and it is therefore difficult to measure the point defects of group III elements. Due to these circumstances, the mechanism of lowering the absorption coefficient of the group III nitride crystal by the addition of the hydrogen element is difficult to specify and is only based on the inference by the present inventors.

A group III nitride crystal, a method of manufacturing a group III nitride crystal, and a manufacturing apparatus for a group III nitride crystal according to embodiments in the present disclosure will now be described in detail.

First Embodiment

<Group III Nitride Crystal>

A group III nitride crystal according to a first embodiment (hereinafter also referred to as a crystal X) is doped with an N-type dopant and a hydrogen element. The concentration of the N-type dopant in the crystal X is $1 \times 10$ cm$^{-3}$ or more. The concentration of the hydrogen element in the crystal X is $1 \times 10^{19}$ cm$^{-3}$ or more.

The crystal X has excellent conductivity due to doping with the N-type dopant at a concentration of $1 \times 10^2$ cm$^{-3}$ or more. Therefore, a group III nitride substrate formed by using the crystal X is useful for high-frequency or high-power electronic devices etc. In addition to the N-type dopant, the crystal X is doped with the hydrogen element at a concentration of $1 \times 10^{19}$ cm$^{-3}$ or more. As a result, the crystal X can have a low absorption coefficient even though the N-type dopant is contained at a concentration of $1 \times 10^{20}$ cm$^{-3}$ or more. Therefore, the crystal X is hardly colored even though the N-type dopant is contained at a concentration of $1 \times 10^2$ cm$^{-3}$ or more. A processing method using a laser requires sufficient light to enter a processed portion of a workpiece. Therefore, in the light wavelength range used for processing, the absorption coefficient of the processed portion of the workpiece needs to be sufficiently low. For example, when a group III nitride substrate is produced from the crystal X by laser processing, laser light is hardly absorbed by the crystal X due to the low absorption coefficient of the crystal X, so that the crystal X can favorably be processed.

The N-type dopant may contain at least one selected from the group consisting of a silicon element, a germanium element, and an oxygen element. In this case, the conductivity of the crystal X can favorably be increased.

The N-type dopant may contain the oxygen element In this case, particularly when the crystal X is produced by the OVPE method, the oxygen element can favorably be added to the crystal X.

The concentration of the N-type dopant may be $7 \times 10^{20}$ cm$^{-3}$ or more and $5 \times 10^{21}$ cm$^{-3}$ or less. In this case, the conductivity of the crystal X can further be increased.

The concentration of the hydrogen element may be $1 \times 10^{19}$ cm$^{-3}$ or more and $1 \times 10^2$ cm$^{-3}$ or less. In this case, the crystal X has more excellent conductivity and the crystal X can have a lower absorption coefficient, so that the coloring of the crystal X can further be prevented.

A light having an energy achieving the absorption coefficient of the crystal X of 60 cm$^{-1}$ or less may exist within a range less than the bandgap energy value of the crystal X. When a semiconductor material is processed, a light having an energy equal to or greater than the bandgap energy value of the semiconductor material is easily absorbed near the surface of the semiconductor material.

Therefore, when the crystal X is processed, the processing may be performed by using a laser that outputs a light having an energy lower than the bandgap energy value of the crystal X. Particularly, since the processing is performed with the light having an energy achieving the absorption coefficient of 60 cm$^{-1}$ or less, the light for processing is hardly absorbed by the crystal X. Therefore, the crystal X can particularly favorably be processed, and a material loss can be reduced when the group III nitride substrate is manufactured from the crystal X. Additionally, since the processing is performed with the light having an energy achieving the absorption coefficient of 60 cm$^{-1}$ or less, the light used for processing easily reaches from the surface to a deep part of the crystal X even when a group III nitride substrate having, for example, a thickness of 100 µm or more is manufactured from the crystal X. Therefore, the processing can favorably be performed.

The value of the bandgap energy differs depending on a composition of the crystal X. For example, in the processing of gallium nitride, the processing can favorably be performed by using a laser that outputs a light having an energy of less than the band gap of 3.39 eV. In the processing of aluminum nitride, the processing can favorably be performed by using a laser that outputs a light having an energy of less than the band gap of 6.2 eV. A lower limit of the energy value of light used for processing is not particularly limited and may be 1 eV, for example. By using the light of 1 eV or more for processing, the laser light is hardly absorbed by a high-concentration free carrier existing in the crystal X having a high concentration of the N-type dopant, so that the laser light easily enters the inside of the crystal. In this case, the light having an energy achieving the absorption coefficient of the crystal X of 60 cm$^{-1}$ or less may exist within a range of 1 eV or more and less than the bandgap energy value of the crystal X.

The light having an energy achieving the absorption coefficient of the crystal X of 60 cm-1 or less may exist within a range less than 3.39 eV. When the crystal X is gallium nitride, the crystal X can particularly favorably be processed by using the light having an energy achieving the absorption coefficient of 60 cm$^{-1}$ or less within a range of 1 eV or more and less than 3.39 eV. The light having an energy achieving the absorption coefficient of the crystal X of 60 cm$^{-1}$ or less may exist within the range of 1 eV or more and less than 3.39 eV.

The electrical resistivity of the crystal X may be 1 mf-cm or less. In this case, the group III nitride substrate produced by using the crystal X can have excellent conductivity. The electrical resistivity of the crystal X is, for example, 0.7 mΩ-cm or less.

By processing the crystal X, the group III nitride substrate can be obtained. Therefore, the group III nitride substrate according to the present disclosure contains the crystal X. The thickness of the group III nitride substrate may be 100 µm or more. In this case, the group III nitride substrate has higher strength.

<Method of Manufacturing Group III Nitride Crystal>

A method of manufacturing the crystal X (group III nitride crystal) will be described with reference to FIG. 1. Although the crystal X is manufactured by using a gas In the example described below, the crystal X of the present disclosure can be obtained even when manufactured in a solution or a melt.

The method of manufacturing the crystal X includes a step of introducing a raw material gas and a step of generating and growing the crystal X. At the step of introducing the raw material gas, a group III element-containing gas, a nitrogen element-containing gas, an N-type dopant-containing gas, and a hydrogen element-containing gas are introduced. At the step of generating and growing the crystal X, the introduced group III element-containing gas, the nitrogen element-containing gas, the N-type dopant-containing gas, and the hydrogen element-containing gas are reacted to generate and grow the crystal X on a seed substrate 201 disposed on a substrate tray 202.

Four different types of gas may be used as the raw material gas, or three or less types of gas may be used. Specifically, the group III element-containing gas, the nitrogen element-containing gas, the N-type dopant-containing gas, and the hydrogen element-containing gas may be different from each other or may be the same. For example, the same gas may be used as the nitrogen element-containing gas and the hydrogen element-containing gas. The same gas may be used as the group III element-containing gas and the N-type dopant-containing gas.

In the method of manufacturing a group III nitride crystal according to the first embodiment, the group III element-containing gas may contain at least one of an oxide of the group III element and a halide of the group III element. In this case, the gas concentration of the group III element-containing gas can be kept high. Additionally, the growth rate of the crystal X can be increased. When gallium nitride is manufactured, the group III element-containing gas particularly may contain at least one of $Ga_2O$ and GaCl.

In the manufacturing method of this embodiment, when a group III element oxide gas or a group III element halide gas is used as the group III element-containing gas, the method may further include a step of generating the group III element-containing gas by reacting a group III element-containing material with a gas. In this case, it becomes easy to prevent the gas from becoming unstable in an environment that is not high temperature, causing a solid to precipitate, and making it difficult to control supply of the gas. The step of generating the group III element-containing gas may include at least one of the steps of reacting the group III element-containing material with an oxidizing gas or a halide gas and reducing a solid oxide of the group III element with a hydrogen gas to generate an oxide gas of the group III element.

The oxidizing gas may contain at least one of water vapor and an oxygen gas. The halide gas may contain HCl.

Examples of the reaction between the group III element-containing material and the oxidizing gas include, for example,

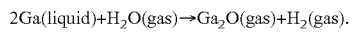
2Ga(liquid)+$H_2$O(gas)→$Ga_2$O(gas)+$H_2$(gas).

Examples of the reaction between the group III element-containing material and the halide gas include, for example,

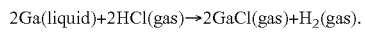
2Ga(liquid)+2HCl(gas)→2GaCl(gas)+$H_2$(gas).

Examples of the reaction between the solid oxide of the group III element and the hydrogen gas include, for example,

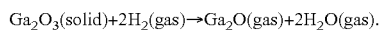
$Ga_2O_3$(solid)+2$H_2$(gas)→$Ga_2$O(gas)+2$H_2$O(gas).

<Nitrogen Element-Containing Gas>

In the method of manufacturing a group III nitride crystal according to this embodiment, the nitrogen element-containing gas may contain at least one selected from the group consisting of an ammonia gas, a hydrazine gas, and a dimethylhydrazine gas. The ammonia gas, the hydrazine gas, and the dimethylhydrazine gas have a boiling point of 200° C. or less, can therefore more easily be supplied into a reaction vessel In a gaseous state, and have higher reactivity. Therefore, the crystal X can more favorably be grown.

<N-Type Dopant-Containing Gas>

In the method of manufacturing a group III nitride crystal according to this embodiment, the N-type dopant-containing gas may contain at least one selected from the group consisting of a silicon element-containing gas, a germanium element-containing gas, and an oxygen element-containing gas. In this case, the gas can easily be supplied into a reaction vessel in a gaseous state at room temperature, and the reactivity is excellent, so that the crystal X can favorably be grown. The N-type dopant-containing gas more may contain the oxygen element-containing gas.

<Silicon Element-Containing Gas>

The silicon element-containing gas may contain at least one selected from the group consisting of $SiH_4$, $SiH_3Cl$, and $SiH_2Cl_2$. In this case, the silicon element-containing gas In a gaseous state can easily be supplied at room temperature into a reaction vessel, and the reactivity is high, so that the crystal X can favorably be grown.

<Germanium Element-Containing Gas>

The germanium element-containing gas may contain at least one selected from the group consisting of $GeH_4$, $GeH_3Cl$, and $GeH_2Cl_2$. In this case, the germanium element-containing gas in a gaseous state can easily be supplied at room temperature into a reaction vessel, and the reactivity is high, so that the crystal X can favorably be grown.

<Oxygen Element-Containing Gas>

The oxygen element-containing gas may contain at least one selected from the group consisting of water vapor, oxygen gas, $N_2O$ gas, NO gas, $NO_2$ gas, CO gas, and $CO_2$ gas. In this case, the oxygen element-containing gas in a gaseous state can easily be supplied at room temperature into a reaction vessel, and the reactivity is high, so that the crystal X can favorably be grown.

The N-type dopant-containing gas particularly may contain at least one selected from the group consisting of GeO gas, $Ga_2O$ gas, and $In_2O$ gas. In this case, the N-type dopant-containing gas can easily be generated at a temperature near the manufacturing temperature of the crystal X, and the reactivity is high, so that the crystal X can favorably be grown.

<Hydrogen Element-Containing Gas>

In the method of manufacturing a group III nitride crystal according to this embodiment, at least one selected from the group consisting of an N—H bond, a C—H bond, and an O—H bond is contained. In this case, the hydrogen element-containing gas in a gaseous state can easily be supplied at room temperature into a reaction vessel, and the reactivity is excellent, so that the crystal X can favorably be grown. Since the hydrogen element-containing gas contains at least one selected from the group consisting of an N—H bond, a C—H bond, and an O—H bond, the coloring of crystal X can be prevented to further lower the absorption coefficient. It is inferred that this is because hydrogen atoms can favorably be added to the group III element vacancy defects In the crystal X.

<Gas Having N—H Bond>

The gas having the N—H bond may contain at least one selected from the group consisting of an ammonia gas, a hydrazine gas, a methylamine gas, and an ethylamine gas. In this case, the NH bond-containing gas in a gaseous state can easily be supplied at room temperature into a reaction vessel, and the reactivity is excellent, so that the crystal X can particularly favorably be grown.

<Gas Having C—H Bond>

The gas having the C—H bond may contain at least one selected from the group consisting of a methane gas, an ethane gas, a propane gas, a butane gas, an ethylene gas, an acetylene gas, a methylamine gas, and an ethylamine gas. In this case, the C—H bond-containing gas in a gaseous state can easily be supplied at room temperature into a reaction vessel, and the reactivity is excellent, so that the crystal X can particularly favorably be grown.

<Gas Having O—H Bond>

The gas having the O—H bond may contain at least one selected from the group consisting of water vapor, hydrogen peroxide, methanol, and ethanol. In this case, since the boiling point of the C—H bond-containing gas is 160° C. or lower, the C—H bond-containing gas can easily be supplied into a reaction vessel, and the reactivity is excellent, so that the crystal X can particularly favorably be grown.

The hydrogen element-containing gas may particularly contain at least one selected from the group consisting of an ammonia gas, a hydrazine gas, a methylamine gas, an ethylamine gas, a methane gas, an ethane gas, a propane gas, a butane gas, an ethylene gas, an acetylene gas, water vapor, hydrogen peroxide, methanol, and ethanol.

In the method of manufacturing a group III nitride crystal according to this embodiment, respective different gases or the same type of gas may be used as the group III element-containing gas, the nitrogen element-containing gas, the N-type dopant-containing gas, the hydrogen element-containing gas, and the carrier gas. For example, $Ga_2O$ gas may be used as the group III element-containing gas, and $Ga_2O$ may be used as the N-type dopant-containing gas. When the same type of gas is used in this way, gas introduction routes can be integrated, and manufacturing equipment can be simplified in some cases.

In the method of manufacturing a group III nitride crystal according to this embodiment, the temperature of the reaction between the group III element-containing gas and the nitrogen element-containing gas at the growing step of growing the crystal X may be 700° C. or higher and 1500° C. or lower from the viewpoint of the reactivity of the gas used for manufacturing. The temperature is, for example, 1000° C. or higher and 1400° C. or lower from the viewpoint of ensuring a crystal growth rate and improving a crystal quality.

The method of manufacturing a group III nitride crystal according to this embodiment can be performed, for example, by using a manufacturing apparatus for a group III nitride crystal shown in FIG. 1. The manufacturing apparatus for a group III nitride crystal shown In FIG. 1 is merely an example, and an apparatus capable of manufacturing the crystal X of the present disclosure is not limited to the manufacturing apparatus shown in FIG. 1. In FIG. 1, sizes and ratios of portions may differ from the actual sizes and ratios for easy understanding. FIG. 1 may include a material required to be disposed in the manufacturing apparatus in advance at the time of manufacturing of the crystal X.

<Manufacturing Apparatus for Group III Nitride Crystal>

This manufacturing apparatus for a group III nitride crystal includes a hydrogen element-containing gas introduction pipe 102, an N-type dopant-containing gas introduction pipe 103, a nitrogen element-containing gas introduction pipe 104, a group III element-containing gas introduction pipe 105, and a gas exhaust pipe 109 connected to a reaction vessel 101. A seed substrate 201 is placed on a substrate tray 202 disposed inside the reaction vessel. The arrangement of the hydrogen element-containing gas introduction pipe 102, the N-type dopant-containing gas introduction pipe 103, the nitrogen element-containing gas introduction pipe 104, and the group III element-containing gas introduction pipe 105 is not limited to that shown in FIG. 1.

As described above, four different types of gas may be used as the raw material gas, or three or less types of gas may be used. Therefore, although the manufacturing apparatus shown in FIG. 1 is provided with the four introduction pipes, which are the hydrogen element-containing gas introduction pipe 102, the N-type dopant-containing gas introduction pipe 103, the nitrogen element-containing gas introduction pipe 104, and the group III element-containing gas introduction pipe 105, the present disclosure is not limited thereto, and the manufacturing apparatus may have three or less introduction pipes.

The group III element-containing gas reacts with the nitrogen element-containing gas, and the crystal X grows on the seed substrate 201. Unreacted and by-product gases are discharged from the gas exhaust pipe 109.

The group III element-containing gas is generated in a group III element-containing gas generating part 106 by reacting a group III element-containing material 107 with a group III element-containing gas generation gas introduced from a group III element-containing gas generation gas introduction pipe 108.

The introduction pipes or reaction parts of the gases may be heated by heaters and adjusted so as to achieve the desired reaction states of the gasses or the growth conditions of the crystal X. For example, as shown In FIG. 1, the manufacturing apparatus may be provided with at least one of a reaction vessel heater III adjacent to the reaction vessel 101, a hydrogen element-containing gas introduction pipe heater 112 adjacent to the hydrogen element-containing gas introduction pipe 102, an N-type dopant-containing gas introduction pipe heater 113 adjacent to the N-type dopant-containing gas introduction pipe 103, a nitrogen element-containing gas introduction pipe heater 114 adjacent to the nitrogen element-containing gas introduction pipe 104, and a group III element-containing gas generating part heater 115 adjacent to the group III element-containing gas generating part 106.

<Group III Element-Containing Material>

The group III element-containing material 107 is a material containing at least one selected from the group consisting of aluminum (Al), gallium (Ga), Indium (In), and thallium (Tl). From the viewpoint of handling at the time of placement, a material in a solid or liquid state at room temperature may be used as the group III element-containing material 107. For example, examples of the group III element-containing material 107 solid at room temperature include $Al_2O_3$, $Ga_2O_3$, $In_2O_3$, $Tl_2O_3$, Al, In, and Tl. Examples of the group III element-containing material 107 liquid at room temperature include Ga.

Examples of the gas introduced into the group III element-containing gas generating part 106 to generate the group III element-containing gas include a hydrogen gas, a water vapor gas, and a hydrogen chloride gas. The gas introduced into the group III element-containing gas generating part 106 may be mixed and introduced with the carrier gas from the viewpoint of reaction control.

<Carrier Gas>

Although the carrier gas is not particularly limited, examples of the carrier gas include a nitrogen gas, a hydrogen gas, an argon gas, and a helium gas. A gas acquired by mixing these gases may be used as the carrier gas.

<Seed Substrate>

The material of the seed substrate 201 is not particularly limited and can appropriately be selected in accordance with the characteristics of the crystal X to be manufactured. For example, it is desirable that the seed substrate 201 is a single crystal substrate having the same element composition ratio as the crystal X to be manufactured. Examples of the material of the seed substrate 201 include sapphire, $ScAlMgO_4$, group III nitride, $LiAlO_2$, and ZnO.

The present disclosure is not limited to the embodiments. For example, the constituent elements described above may arbitrarily be combined, or another embodiment achieved by excluding some of the constituent elements described above may be considered as an embodiment of the present disclosure.

EXAMPLES

A method of manufacturing a group III nitride crystal according to Examples 1 to 4 and Comparative Example will be described.

In Example 1, a gallium nitride crystal was manufactured as the group III nitride crystal by using gas. A $Ga_2O$ gas was used as the group III element-containing gas and the N-type dopant-containing gas, an ammonia gas was used as the nitrogen element-containing gas, and an ammonia gas was used as the hydrogen element-containing gas. Ga was used as the group III element-containing material, and an oxygen gas was used as the group III element-containing gas generation gas. A gallium nitride crystal was used as the seed substrate 201.

First, Ga was placed in the group III element-containing gas generating part 106, and $Ga_2O$ was generated by using the oxygen gas. The generated $Ga_2O$ was supplied from the group III element-containing gas introduction pipe 105 to the reaction vessel 101. The ammonia gas was introduced as the nitrogen element-containing gas from the nitrogen element-containing gas introduction pipe 104 into the reaction vessel 101. The ammonia gas was introduced as the hydrogen element-containing gas from the hydrogen element-containing gas introduction pipe 102 into the reaction vessel 101 to manufacture the group III nitride crystal.

The manufacturing conditions for the group III nitride crystal will be described in detail. First, the heaters (111, 112, 113, 114, 115) were heated. After the temperature of the group III element-containing gas generating part 106 reached 1100° C. and the temperature of the reaction vessel reached 1200° C., the oxygen gas was introduced into the group III element-containing gas generating part 106 at a flow rate of 20 sccm, and a mixed gas of nitrogen and hydrogen was introduced as the carrier gas at the same time at a flow rate of 5 slm and reacted on Ga placed in the group III element-containing gas generating part 106 to generate a $Ga_2O$ gas, and the obtained $Ga_2O$ gas was introduced as the group III element-containing gas and the N-type dopant-containing gas into the reaction vessel 101. The ammonia gas serving as the nitrogen element-containing gas was introduced at a flow rate of 0.5 slm, the ammonia gas serving as the hydrogen element-containing gas was introduced at a flow rate of 1 slm, and the mixed gas of nitrogen and hydrogen was introduced as the carrier gas thereof at a flow rate of 40 slm, into the reaction vessel 101. In the reaction vessel 101, the $Ga_2O$ gas and the ammonia gas reacted with each other to generate a gallium nitride crystal on the seed substrate 201. The gallium nitride crystal generation reaction was performed for 6 hours. In this way, a gallium nitride crystal having a thickness of 300 μm was manufactured as an epitaxial layer on the GaN substrate.

The gallium nitride crystal of Example 2 was manufactured as In Example 1 except that the flow rate of the ammonia gas serving as the hydrogen element-containing gas was 1.5 slm.

The gallium nitride crystal of Example 3 was manufactured as in Example 1 except that methane gas was used as the hydrogen element-containing gas.

The gallium nitride crystal of Example 4 was manufactured as in Example 1 except that water vapor was used as the hydrogen element-containing gas and that the flow rate of the water vapor was set to 10 sccm.

The gallium nitride crystal of Comparative Example was manufactured as In Example 1 except that the hydrogen element-containing gas was not used.

The crystals manufactured In Examples 1 to 4 were each polished to a thickness of 150 μm to manufacture a free-standing gallium nitride substrate composed only of a crystal layer. The crystal manufactured In Comparative Example was polished to a thickness of 200 μm to manufacture a free-standing gallium nitride substrate composed only of a crystal layer.

By using the substrates of Examples 1 to 4 and Comparative Example obtained in this way, characteristics shown In Table 1 were evaluated. Regarding the absorption coefficient, a minimum value of the absorption coefficient was measured with respect to the absorption coefficient for light having an energy within a range equal to or less than the band gap energy of 3.39 eV of gallium nitride.

TABLE 1

| | Example 1 | Example 2 | Example 3 | Example 4 | Comparative Example |
|---|---|---|---|---|---|
| oxygen concentration (atoms/cm³) | $7.2 \times 10^{20}$ | $7.1 \times 10^{20}$ | $9.4 \times 10^{20}$ | $1.9 \times 10^{21}$ | $4.3 \times 10^{20}$ |
| hydrogen concentration (atoms/cm³) | $1.4 \times 10^{19}$ | $1.8 \times 10^{19}$ | $7.2 \times 10^{19}$ | $6.5 \times 10^{19}$ | $<1.2 \times 10^{17}$ |
| minimum value of absorption coefficient (cm⁻¹) | 33 | 26 | 18 | 28 | 74 |
| resistivity (mΩ·cm) | $6.40 \times 10^{-4}$ | $5.76 \times 10^{-4}$ | $5.93 \times 10^{-4}$ | $5.65 \times 10^{-4}$ | $7.67 \times 10^{-4}$ |

As a result of analysis of concentration of impurities in the gallium nitride crystal manufactured in Example 1 by SIMS, the concentration of the oxygen element was $7.2 \times 10^{20}$ atoms/cm³, and the concentration of the hydrogen element was $1.4 \times 10^{19}$ atoms/cm³. The resistivity was $6.40 \times 10^{-4}$ Ω·cm, and the minimum value of the absorption coefficient was the absorption coefficient of 33 cm⁻¹ for the light having an energy of 1.85 eV. In Example 1, the concentrations of the oxygen element and the hydrogen element were high, the resistivity was low, and the absorption coefficient was small.

As a result of analysis of concentration of impurities in the gallium nitride crystal manufactured in Example 2 by SIMS, the concentration of the oxygen element was $7.1 \times 10^{20}$ atoms/cm³, and the concentration of the hydrogen element was $1.8 \times 10^{19}$ atoms/cm³. The resistivity was $5.76 \times 10^{-4}$ Ω·cm, and the minimum value of the absorption coefficient was the absorption coefficient of 26 cm⁻¹ for the light having an energy of 1.92 eV. As compared to Example 1, since the amount of supply of the ammonia gas for the hydrogen element-containing gas was increased, the hydrogen concentration in the crystal was increased and the absorption coefficient was reduced.

As a result of analysis of concentration of impurities In the gallium nitride crystal manufactured In Example 3 by SIMS, the concentration of the oxygen element was $9.4 \times 10^{20}$ atoms/cm³, and the concentration of the hydrogen element was $7.2 \times 10^{19}$ atoms/cm³. The resistivity was 5.93×

$10^{-4}$ Ω·cm, and the minimum value of the absorption coefficient was the absorption coefficient of 18 cm$^{-1}$ for the light having an energy of 1.94 eV.

As a result of analysis of concentration of impurities in the gallium nitride crystal manufactured in Example 4 by SIMS, the concentration of the oxygen element was $1.9 \times 10^{21}$ atoms/cm$^3$, and the concentration of the hydrogen element was $6.5 \times 10^{19}$ atoms/cm$^3$. The resistivity was $5.65 \times 10^{-4}$ Ω·cm, and the minimum value of the absorption coefficient was the absorption coefficient of 28 cm$^{-1}$ for the light having an energy of 1.92 eV.

As a result of analyzing the concentration of impurities in the gallium nitride crystal manufactured in Comparative Example by SIMS, the concentration of the oxygen element was $4.3 \times 10^{20}$ atoms/cm$^3$, and the concentration of the hydrogen element was less than the detection limit of $1.2 \times 10^{17}$ atoms/cm$^3$. The resistivity was $7.64 \times 10^{-4}$ Ω·cm, and the minimum value of the absorption coefficient was the absorption coefficient of 74 cm$^{-1}$ for the light having an energy of 1.33 eV.

As shown in Table 1, it can be seen that al the group III nitride crystals manufactured in Examples 1 to 4 and Comparative Example have a high oxygen element concentration of $1 \times 10^{20}$ atoms/cm$^3$ or more, and therefore have a low resistivity of 1 mΩ·cm or less. For the crystals of Examples 1 to 4 having a hydrogen element concentration of $1 \times 10^{19}$ atoms/cm$^3$ or more, a light having an energy achieving an absorption coefficient of 60 cm$^{-1}$ or less exists within a range less than the band gap energy value. On the other hand, in Comparative Example, the minimum value of the absorption coefficient is 74 cm$^{-1}$ within the range less than the bandgap energy value. Therefore, it can be seen that the absorption coefficient is significantly reduced In the crystals of Examples as compared to the crystal of Comparative Example.

Figure 2:
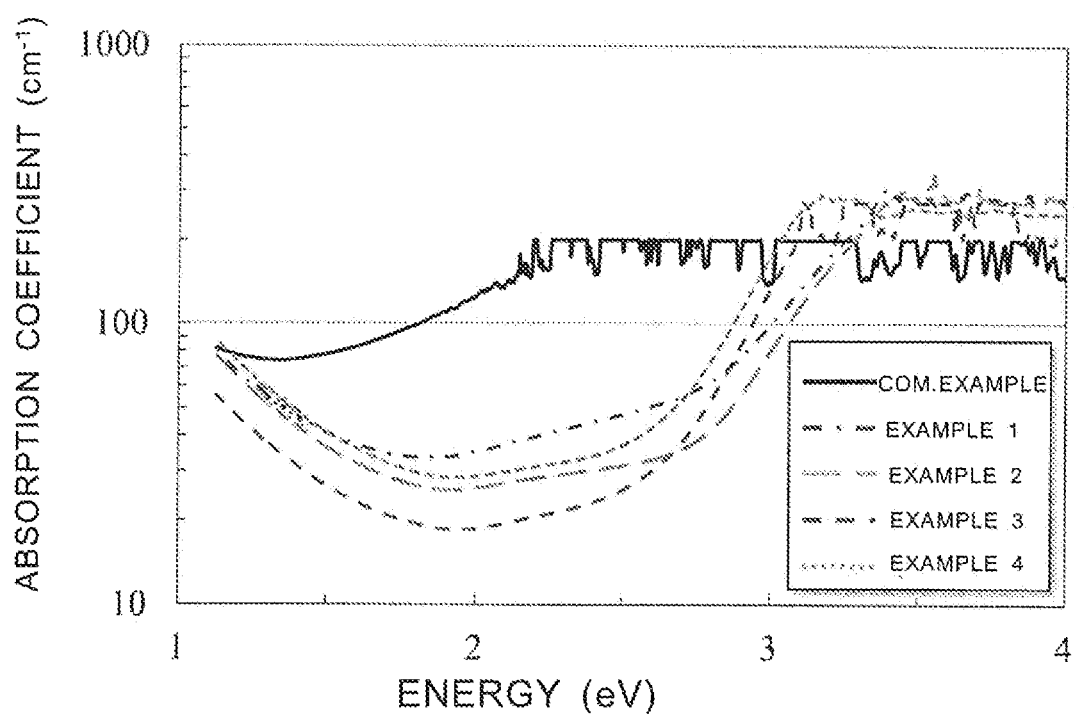
FIG. 2 is a graph showing absorption coefficients of group III nitride crystals manufactured in Examples and Comparative Example.

The absorption coefficients of the group III nitride crystals manufactured In Examples 1 to 4 and Comparative Example are shown In a graph of FIG. 2. FIG. 2 shows a relationship between an energy value of light and an absorption coefficient for the light. As shown in FIG. 2, in Examples 1 to 4, in which the concentration of the hydrogen element In the crystal is two orders of magnitude higher than that of Comparative Example, the absorption coefficient has a low value in a wide range in an energy region smaller than the band edge energy of 3.39 eV. In FIG. 2, for the crystal manufactured in Comparative Example, the absorption coefficient was excessively high and was not satisfactorily measured In the energy region of 2.19 eV or higher.

From the above results, in the group III nitride crystal of the present disclosure, even when the concentration of the N-type dopant in the crystal is increased so as to reduce the electrical resistivity, the absorption coefficient can be reduced in a wide energy region by containing the hydrogen element in the crystal at a specific concentration or more. Therefore, the inside of the crystal can be processed by using a laser.

The present disclosure includes appropriately combining any embodiments and/or examples out of the various embodiments and/or examples described above, and the effects of the respective embodiments and/or examples can be produced.

As described above, according to the group III nitride crystal, the method of manufacturing a group III nitride crystal, and the manufacturing apparatus for a group III nitride crystal according to the present disclosure, the group III element nitride crystal having a high conductivity can be processed with less material loss to produce a group III nitride semiconductor substrate, so that higher performance and lower costs of high-frequency or high-power electronic devices can be expected.

EXPLANATIONS OF LETTERS OR NUMERALS 101 reaction vessel
102 hydrogen element-containing gas introduction pipe
103 N-type dopant-containing gas introduction pipe
104 nitrogen element-containing gas introduction pipe
105 group III element-containing gas introduction pipe
106 group III element-containing gas generating part
107 group III element-containing material
108 group III element-containing gas generation gas introduction pipe
109 gas exhaust pipe
III reaction vessel heater
112 hydrogen element-containing gas introduction pipe heater
113 N-type dopant-containing gas introduction pipe heater
114 nitrogen element-containing gas introduction pipe heater
115 group III element-containing gas generating part heater
201 seed substrate
202 substrate tray

What is claimed is:

1. A group III nitride crystal,
wherein the group III nitride crystal is doped with an N-type dopant and a hydrogen element and has an electrical resistivity of 1 mΩ·cm or less,
the concentration of the N-type dopant is $1 \times 10^{20}$ cm$^{-3}$ or more, and
the concentration of the hydrogen element is $1 \times 10^{10}$ cm$^{-3}$ or more.

2. The group III nitride crystal according to claim 1, wherein the concentration of the N-type dopant is $7 \times 10^{20}$ cm$^{-3}$ or more and $5 \times 10^{21}$ cm$^{-3}$ or less.

3. The group III nitride crystal according to claim 1, wherein the N-type dopant contains at least one selected from the group consisting of a silicon element, a germanium element, and an oxygen element.

4. The group III nitride crystal according to claim 3, wherein the N-type dopant contains the oxygen element.

5. The group III nitride crystal according to claim 1, wherein a light having an energy achieving an absorption coefficient of 60 cm$^{-1}$ or less exists within a range less than a band gap energy value of the group III nitride crystal.

6. The group III nitride crystal according to claim 1, wherein a light having an energy achieving an absorption coefficient of the group III nitride crystal of 60 cm$^{-1}$ or less exists within a range less than 3.39 eV.

7. A group III nitride substrate including the group III nitride crystal according to claim 1.

8. The group III nitride substrate according to claim 7, wherein the group III nitride substrate has a thickness of 100 μm or more.

* * * * *